(12) United States Patent
Sonderman et al.

(10) Patent No.: US 7,160,740 B2
(45) Date of Patent: Jan. 9, 2007

(54) METHODS OF CONTROLLING PROPERTIES AND CHARACTERISTICS OF A GATE INSULATION LAYER BASED UPON ELECTRICAL TEST DATA, AND SYSTEM FOR PERFORMING SAME

(75) Inventors: Thomas J. Sonderman, Austin, TX (US); Pirainder Lall, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 186 days.

(21) Appl. No.: 10/614,354

(22) Filed: Jul. 7, 2003

(65) Prior Publication Data

US 2005/0009217 A1 Jan. 13, 2005

(51) Int. Cl.
*H01L 21/66* (2006.01)
(52) U.S. Cl. .................................. 438/14; 365/185.28
(58) Field of Classification Search ................ 438/14, 438/278, 288, 289, FOR. 212; 257/314, 257/E27.078, E21.68; 365/185.28, 185.14, 365/185.33
See application file for complete search history.

(56) References Cited

U.S. PATENT DOCUMENTS

| | | | | |
|---|---|---|---|---|
| 5,793,675 | A * | 8/1998 | Cappelletti et al. | 365/185.09 |
| 5,798,649 | A * | 8/1998 | Smayling et al. | 324/551 |
| 5,821,766 | A * | 10/1998 | Kim et al. | 324/769 |
| 6,133,746 | A * | 10/2000 | Fang et al. | 324/769 |
| 6,228,663 | B1 * | 5/2001 | Gardner et al. | 438/14 |
| 6,232,631 | B1 * | 5/2001 | Schmidt et al. | 257/315 |
| 6,282,123 | B1 * | 8/2001 | Mehta | 365/185.28 |
| 6,472,233 | B1 * | 10/2002 | Ahmed et al. | 438/14 |
| 6,882,567 | B1 * | 4/2005 | Wong | 365/185.03 |
| 2002/0090747 | A1 * | 7/2002 | Gerstmeier et al. | 438/18 |
| 2003/0129775 | A1 * | 7/2003 | Kline | 438/14 |
| 2004/0087180 | A1 * | 5/2004 | Hishiya et al. | 438/770 |

OTHER PUBLICATIONS

PCT Search Report from PCT/US2004/017091 dated Oct. 15, 2004.
"Method to Make BICMOS Device Data Available Early in Process," IBM Technical Disclosure Bulletin, vol. 33, No. 9, pp. 8-9, 1991.

* cited by examiner

*Primary Examiner*—Matthew Smith
*Assistant Examiner*—Khiem Nguyen
(74) *Attorney, Agent, or Firm*—Williams, Morgan & Amerson, P.C.

(57) ABSTRACT

The present invention is generally directed to various methods of controlling properties and characteristics of a gate insulation layer based upon electrical test data, and a system for performing same. In one illustrative embodiment, the method comprises performing at least one electrical test on at least one semiconductor device, determining at least one parameter of at least one process operation to be performed to form at least one gate insulation layer on a subsequently formed semiconductor device based upon electrical data obtained from the electrical test, and performing at least one process operation comprised of the determined parameter to form the gate insulation layer.

11 Claims, 2 Drawing Sheets

METHODS OF CONTROLLING PROPERTIES AND CHARACTERISTICS OF A GATE INSULATION LAYER BASED UPON ELECTRICAL TEST DATA, AND SYSTEM FOR PERFORMING SAME

BACKGROUND OF THE INVENTION

1. Field of the Invention

This invention relates generally to semiconductor fabrication technology, and, more particularly, to various methods of controlling properties and characteristics of a gate insulation layer based upon electrical test data, and a system for performing same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor or the thinner the gate insulation layer, the faster the transistor will operate. Thus, there is a constant drive to reduce the size, or scale, of the components of a typical transistor to increase the overall speed of the transistor, as well as integrated circuit devices incorporating such transistors.

Memory devices such as erasable programmable read-only memories (EPROMs), electrically erasable programmable read-only memories (EEPROMs), or flash erasable programmable read-only memories (FEPROMs) are, as their name indicates, erasable. Such erasable memory cells are used in a variety of different devices, e.g., digital cellular phones, digital cameras, LAN switches, cards for notebook computers, etc. A memory cell operates by storing electric charge (representing an "on" state) to an electrically isolated floating gate, which is incorporated into a transistor. This stored charge affects the behavior of the transistor, thereby providing a way to read the memory element. The switching speed of such a memory cell for converting from an "on" state to an "off" state is limited in part by the speed of charge dissipation from the floating gate (i.e., the erase speed). Because faster erase speeds equate to faster switching speeds, efforts have been made to increase the erase speeds of such memory devices, as well as to improve the erase uniformity among the memory cells.

A flash memory cell typically consists of a source region, a drain region, a tunnel oxide layer, a floating gate, an insulating layer of oxide, a layer of silicon nitride, another layer of oxide, and a control gate positioned above the floating gate in a stacked gate structure. The floating gate, typically comprised of polycrystalline silicon (i.e., "polysilicon"), is electrically isolated from the underlying semiconductor substrate by a thin gate insulation layer, which is typically formed of silicon oxide. Because charge is transferred across the gate insulation layer by quantum-mechanical tunneling, this gate insulation layer is often referred to as a "tunnel oxide" layer. Such tunnel oxide layers are typically approximately 100 Å thick. Properties of the tunnel oxide layer must be strictly controlled to ensure the ability to read and write by tunneling, while avoiding data loss through charge trapping or leakage. The control gate is positioned above the floating gate, and is electrically isolated from the floating gate by a storage dielectric layer, such as an oxide-nitride-oxide (ONO) stack.

Storing charge on the floating gate programs a memory cell. This is achieved via hotelectron injection by applying a high positive voltage (approximately 12V) to the control gate, and a high drain-to-source bias voltage (approximately 45V). An inversion region is created between the source and drain by the control gate voltage, and electrons are accelerated from the source to the drain by the drain bias voltage. Some fraction of these electrons will have sufficient energy to surmount the tunnel oxide barrier height and reach the floating gate. The floating gate is therefore programmed by collecting and storing these electrons to represent an "on" state.

The negative charge captured in the floating gate makes the channel more positive and, thus, less conducting. As a result, the threshold voltage is higher for a charged cell than for an uncharged cell. Consequently, for a given voltage applied to the control gate, the non-volatile memory cell will conduct if the floating gate has no stored charge and will not conduct if the floating gate has stored charge. Therefore, a logical low or high is provided by the non-volatile memory cell based on whether or not the cell conducts at a given threshold voltage.

In order to remove charge from the floating gate, the non-volatile memory cell is irradiated with ultraviolet light. The ultraviolet light provides the stored electrons on the floating gate with enough extra energy to cross the barrier of the tunnel oxide layer. However, this is a relatively time-consuming process. To reduce the time required to complete this process, the temperature of non-volatile memory arrays may be elevated during erasure to add to the energy obtained from the ultraviolet light. The use of elevated temperatures, however, has led to a high incidence of breakage of the relatively thin wafers on which the non-volatile memory arrays are fabricated.

Flash memory devices are a type of EEPROM (Electrically Erasable Programmable Read-Only Memory). The term "flash" refers to the ability of the memory to be erased in blocks. As in other non-volatile memory devices, flash memory devices typically store electrical charges, representing data, in transistors having either a floating gate or a charge trapping dielectric. The stored charges affect the threshold voltage of the transistors. For example, in an n-channel floating gate transistor, an accumulation of electrons in the floating gate electrode increases the threshold voltage of the transistor. The presence or absence of the stored charge can be determined by whether current flows between a source region and a drain region of the transistor when appropriate voltages are applied to the control gate, source and drain.

From the foregoing, it should be understood that the manufacture of a gate insulation layer, and controlling the properties thereof, is a very important aspect of manufacturing semiconductor devices, such as transistors and memory devices. What is desired is methods and systems that assist manufacturers in producing gate insulation layers of the desired qualities and characteristics.

The present invention is directed to various methods and systems that may solve, or at least reduce, some or all of the aforementioned problems.

SUMMARY OF THE INVENTION

The present invention is generally directed to various methods of controlling properties and characteristics of a gate insulation layer based upon electrical test data, and a system for performing same. In one illustrative embodiment, the method comprises performing at least one electrical test on at least one semiconductor device, determining at least one parameter of at least one process operation to be performed to form at least one gate insulation layer on a subsequently formed semiconductor device based upon electrical data obtained from the electrical test, and performing at least one process operation comprised of the determined parameter to form the gate insulation layer on the subsequently formed semiconductor device.

In another illustrative embodiment, the method comprises performing at least one electrical test on at least one memory device, determining at least one parameter of at least one process operation to be performed to form at least one gate insulation layer on a subsequently formed memory device based upon electrical data obtained from the electrical test, and performing the process operation comprised of the determined parameter to form the gate insulation layer on the subsequently formed memory device.

In yet another illustrative embodiment, the method comprises performing at least one electrical test on at least one transistor, determining at least one parameter of at least one process operation to be performed to form at least one gate insulation layer on a subsequently formed transistor based upon electrical data obtained from the electrical test, and performing the process operation comprised of the determined parameter to form the gate insulation layer on the subsequently formed transistor.

In a further illustrative embodiment, the method comprises performing at least one electrical test on at least one memory device to determine a duration of a programming cycle performed on the memory device, determining at least one parameter of at least one process operation to be performed to form at least one gate insulation layer on a subsequently formed memory device based upon the determined duration of the programming cycle, and performing the process operation comprised of the determined parameter to form the gate insulation layer on the subsequently formed memory device.

In yet a further illustrative embodiment, the method comprises performing at least one electrical test on at least one memory device to determine a duration of an erase cycle performed on the memory device, determining at least one parameter of at least one process operation to be performed to form at least one gate insulation layer on a subsequently formed memory device based upon the determined duration of the erase cycle, and performing the process operation comprised of the determined parameter to form the gate insulation layer on the subsequently formed memory device.

BRIEF DESCRIPTION OF THE DRAWINGS

The invention may be understood by reference to the following description taken in conjunction with the accompanying drawings, in which like reference numerals identify like elements, and in which.

Figure 1:
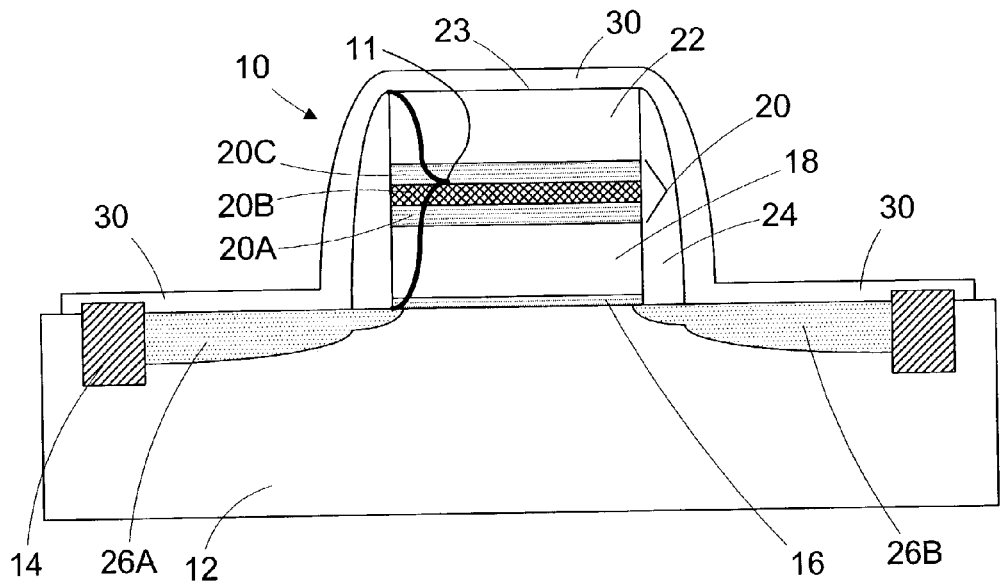
FIG. 1 is a cross-sectional view of a portion of an illustrative prior art memory cell.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various structures and doped regions of the semiconductor device are depicted in the drawings as having very precise, sharp configurations and profiles, those skilled in the art recognize that, in reality, these regions and structures may not be as precise as indicated in the drawings. Additionally, the relative sizes of the various features and implant regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present invention is directed to various methods of controlling properties and characteristics of a gate insulation layer based upon electrical test data, and a system for performing same. As will be readily apparent to those skilled in the art upon a complete reading of the present application, the present invention may be employed in connection with the formation of gate insulation layers in a variety of different types of semiconductor devices, such as memory devices and transistors. Thus, the present invention should not be considered as limited to the particular embodiments disclosed herein unless such limitations are clearly set forth in the appended claims. For purposes of explanation only, the present invention will be disclosed in the context of the manufacture of a gate insulation layer for a memory cell.

FIG. 1 is a cross-sectional depiction of a portion of an illustrative memory cell 10 which may be employed in connection with one illustrative embodiment of the present invention. As shown therein, the memory cell 10 is formed above a semiconducting substrate 12 between shallow trench isolation regions 14 formed in the substrate 12. The memory cell 10 is generally comprised of a film stack 11 that is comprised of multiple layers of material. In one particularly illustrative embodiment, the film stack 11 is comprised of a gate insulation layer 16, sometimes referred to as a "tunnel oxide layer," a floating gate 18, an intermediate insulating layer 20 (typically comprised of a layer of oxide 20A, a layer of nitride 20B, and a layer of oxide 20C) (a so-called ONO stack), and a control gate 22. The intermediate insulating layer 20 is sometimes referred to as an "inter-poly" insulating layer. The memory cell 10 further comprises sidewall spacers 24, a source region 26A, a drain region 26B and a capping insulating layer 30 comprised of, for example, silicon nitride. Although not depicted in FIG. 1, one or more dielectric layers (not shown) may be formed above the capping insulating layer 30. Thereafter, a plurality of conductive contacts (not shown) may be formed in the dielectric layer(s) to provide electrical connection to various components of the memory cell 10. Additional structures may also be provided to complete the formation of the memory cell 10. However, such structures are not depicted in the drawings or discussed herein so as not to obscure the present invention.

A typical memory device, e.g., a flash memory product, may be comprised of millions of the memory cells 10 that are arranged in rows and columns. Read/write operations maybe performed on the individual memory cells 10, or a collection of memory cells, by accessing the cells based on the row and column position of the cells 10. Such accessing techniques are well known to those skilled in the art and thus will not be described in any further detail herein.

The illustrative memory cell 10 depicted in FIG. 1 may be formed by a variety of known techniques, and the various components may be formed by a variety of known techniques. For example, the gate insulation layer 16 may be comprised of a thermally grown layer of silicon dioxide. The floating gate 18 and the control gate 22 may be comprised of polysilicon, doped or undoped. The sidewall spacers 24 may be comprised of a variety of materials, e.g., silicon dioxide, silicon nitride, etc. It should be understood additional layers of material may be formed on a typical memory cell, although such layers are not depicted in FIG. 1. For example, a bottom anti-reflective coating layer (not shown) or another layer of material (not shown) may be formed above the top surface 23 of the control gate 22.

Figure 2:
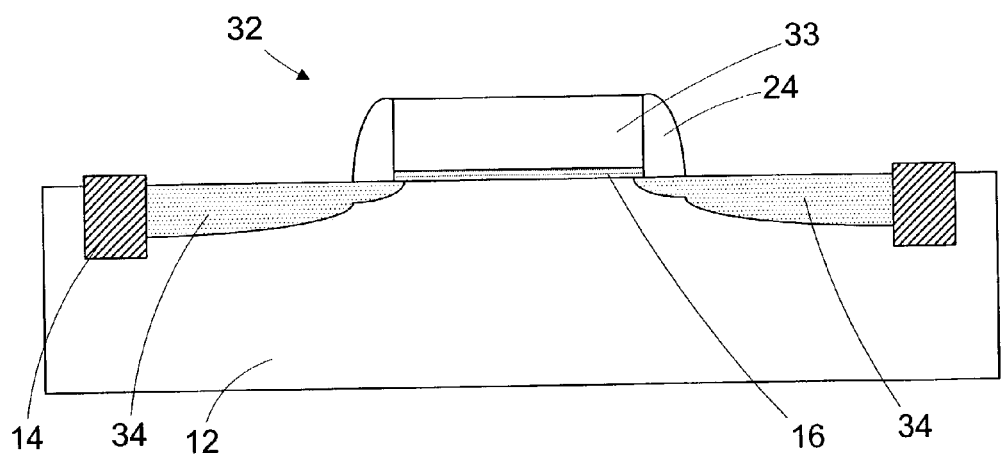
FIG. 2 is a cross-sectional view of a portion of a prior art transistor.

FIG. 2 is a cross-sectional view of an illustrative prior art transistor 32. As shown therein, the transistor 32 is comprised of the gate insulation layer 16, a gate electrode 33, sidewall spacers 24 and source/drain regions 34. The transistor is formed in the substrate 12 between isolation regions 14.

The present invention may be employed in connection with the formation of gate insulation layers 16 for a variety of different types of semiconductor devices, such as memory devices, transistors, microprocessors, application specific integrated circuits, etc. The physical characteristics of the gate insulation layer 16, such as thickness, may vary depending upon the particular application. Moreover, the gate insulation layer 16 may be comprised of a variety of different materials depending on the application, e.g., silicon dioxide and silicon nitride. The gate insulation layer 16 may be formed by a variety of processes, e.g., a thermal growth process, a deposition process, etc. Of course, the electrical and physical characteristics of the gate insulation layers 16 may vary depending on the type of product being manufactured and its intended application. Thus, the illustrative embodiments of the gate insulation layer 16 described and discussed herein, as well as the manner in which such layers are manufactured, should not be considered a limitation of the present invention unless such limitations are clearly set forth in the appended claims.

Figure 3:
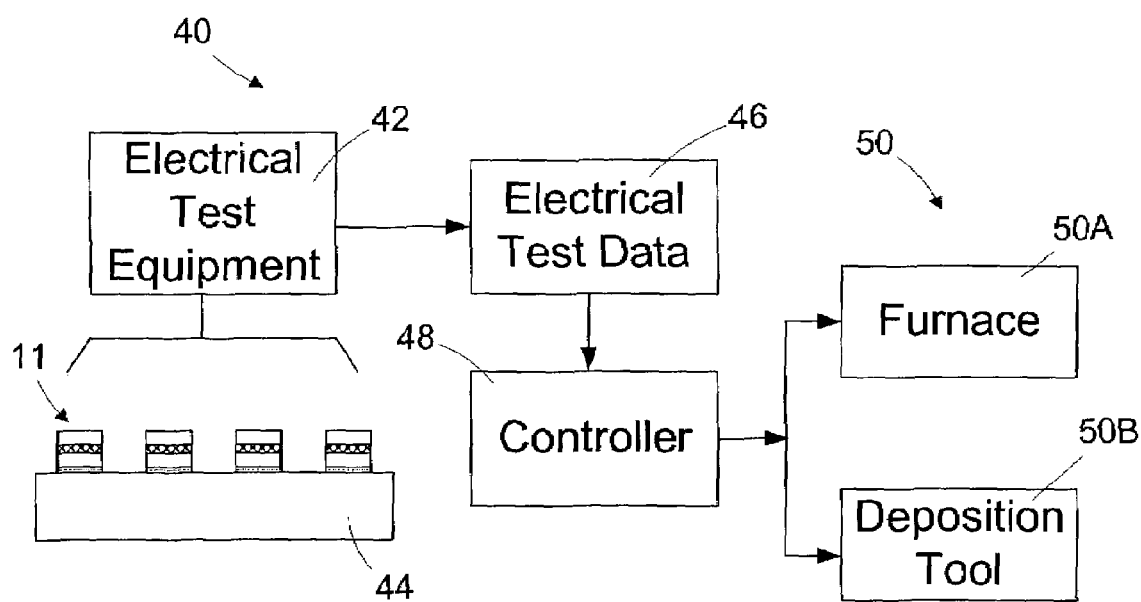
FIG. 3 is a schematic view of one illustrative embodiment of a system that may be used to practice one or more of the various inventive methods described herein.

In one aspect, the present invention is directed to controlling one or more characteristics of the insulating layer 16 based upon various electrical test data. FIG. 3 is a schematic depiction of an illustrative system 40 that may be employed in accordance with one embodiment of the present invention. As shown therein, electrical test equipment 42 may be used to obtain electrical test data 46 for one or more semiconductor devices 44, such as memory devices or transistors, and using that electrical test data to control one or more characteristics or parameters of the gate insulation layers 16 to be formed on subsequent devices. By way of example only, the semiconductor device 44 in FIG. 3 is depicted as having a plurality of gate stacks 11 formed thereabove. For example, as indicated in FIG. 3, the electrical test data 46 may be provided to a controller 48. In turn, the controller 48 may determine, control or adjust one or more parameters of the process tools 50 that may be employed to manufacture gate insulation layers 16 on subsequently formed devices, e.g., transistors, memory cells, etc. In the illustrative embodiment depicted in FIG. 3, the process tools 50 are illustrative depicted as being a furnace 50A and a deposition tool 50B. The types of process tools 50 that may be controlled may vary and may depend upon the particular application, e.g., the desired characteristic and/or materials of the gate insulation layer 16. The process tools 50 may be single or multi-chamber tools.

The electrical test equipment 42 may be any type of equipment capable of performing the electrical testing described herein. Moreover, the electrical test equipment 42 need not be a single piece of equipment, as multiple items of electrical test equipment 42 may be employed to perform the electrical testing on the semiconductor device 44. For example, such electrical test equipment 42 may include, for example, a four-point probe.

The electrical test equipment 42 may be used to collect electrical test data 46 regarding a variety of electrical characteristics of the semiconductor device 44. For example, the electrical test equipment 42 may be used to collect data regarding breakdown voltage (BV), threshold voltage ($V_T$), charge-to-rupture characteristics (QDTR), state charge ($Q_s$), interface charge ($Q_{it}$), trapped charge ($Q_{at}$), surface charge ($Q_{ss}$), programming cycle time, and/or erase cycle time. In some cases, a plurality of the various electrical characteristics identified above may be combined into one or more metrics, e.g., a wafer level reliability metric, representative of the electrical test data 46 for a single wafer or a plurality of wafers. Moreover, such a collection of electrical test data 46 may be averaged or otherwise statistically manipulated prior to taking any control action based upon the electrical test data 46. The electrical testing may be performed as the wafer is being processed, i.e., in-line measurements, or at the end of the line after fabrication is completed.

Based upon the electrical test data 46, the controller 48 may determine, control or adjust one or more parameters of a process operation to be performed in at least one of the process tools 50 that will be used to form insulation layers 16 on subsequently formed semiconductor devices 44. For example, such process operations may include, but are not limited to, deposition processes (e.g., PECVD, CVD, LPCVD) or a thermal growth process. The parameters of such process that may be determined, controlled or adjusted include, but are not limited to, temperature, pressure, duration, process gas composition or flow rate, process liquid composition or flow rate, power levels, etc.

By way of example only, the electrical test data 46 may indicate that the breakdown voltage or charge-to-rupture metric is below acceptable levels. In that situation, the controller 48 may act to control or adjust one or more parameters of the process operations to be performed to form gate insulation layers 16 on subsequent devices. For example, in such a situation, the controller 48 may act to increase the duration of a thermal growth process performed in the furnace 50A that is performed to form gate insulation layers 16 on subsequently formed devices so as to increase the thickness of the gate insulation layer 16 relative to previously manufactured gate insulation layers 16. Other process variables that may be controlled include, but are not limited to, temperature, process gas flow rates, pressures, etc. Thereafter, process operations are performed in the process tools 50 using the determined or adjusted parameters to form the gate insulation layers 16 on additional semiconductor devices.

As another example, if the electrical test data indicates that the duration of the programming cycle for a memory device or cell is too long or exceeds allowable specifications, the thickness of the gate insulation layer on a subsequently formed memory device may be reduced to thereby reduce the programming cycle time on the subsequently formed devices. Similarly, if the duration of the erase cycle for a memory cell or device is determined to be too long, then the thickness of the gate insulation layer on subsequently formed memory devices may be reduced in an effort to decrease the erase cycle time on the later formed memory cells. The present invention could also be employed in situations where it is desirable to increase the thickness of the gate insulation layer, if such situations ever occur. Based upon the determined durations of the programming cycle or the erase cycle, various adjustments may be made to the process parameters used in forming the gate insulation layers on the subsequently formed memory cells to achieve the desired adjustments in thickness of the gate insulation layer.

By making one or more process adjustments based upon the electrical test data 46, semiconductor devices, e.g., memory devices, transistors, etc., may be manufactured such that, after completion, they tend to exhibit the desired electrical performance characteristics. Moreover, since the characteristics of the gate insulation layer 16 are controlled based upon electrical test data, the completed devices have a better chance at meeting performance criteria that is important to the end users of the product, e.g., faster erase cycle times.

In the illustrated embodiment, the controller 48 is a computer programmed with software to implement the functions described herein. Moreover, the functions described for the controller 48 may be performed by one or more controllers spread throughout a semiconductor manufacturing facility. For example, the controller 48 may be a fab level controller that is used to control processing operations throughout all or a portion of a semiconductor manufacturing facility. Alternatively, the controller 48 may be a lower level computer that controls only portions or cells of the manufacturing facility. Moreover, the controller 48 may be a stand-alone device, or it may reside on one or more of the process tools 50. However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as, "processing" or "computing" or "calculating", or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform some of the functions of the controller 48, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699-Provisional Specification for CIM Framework Domain Architecture) and APC (SEMI E93-0999-Provisional Specification for CIM Framework Advanced Process Control Component) specifications are publicly available from SEMI.

The present invention is generally directed to various methods of controlling properties and characteristics of a gate insulation layer based upon electrical test data, and a system for performing same. In one illustrative embodiment, the method comprises performing at least one electrical test on at least one semiconductor device, determining at least one parameter of at least one process operation to be performed to form at least one gate insulation layer on a subsequently formed semiconductor device based upon electrical data obtained from the electrical test, and performing at least one process operation comprised of the determined parameter to form the gate insulation layer. In some embodiments, the semiconductor device is a memory device, such as a flash memory product. In other embodiments, the semiconductor device is a transistor. The gate insulation layer may be formed by a variety of processes, such as a thermal growth process or a deposition process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:

performing at least one electrical test on at least one flash memory device to determine a duration of a programming cycle performed on said flash memory device;

determining at least one parameter of at least one process operation to be performed to form at least one gate insulation layer on a subsequently formed flash memory device based upon said determined duration of said programming cycle, wherein the at least one parameter is comprised of at least one of a temperature, a pressure, a duration, a process gas flow rate, a process gas composition, a liquid flow rate, a liquid composition, and a power level setting; and performing said at least one process operation comprised of said determined at least one parameter to form said at least one gate insulation layer on said subsequently formed flash memory device.

2. The method of claim 1, wherein performing said at least one electrical test on said at least one flash memory device further comprises performing said at least one electrical test on said at least one flash memory device to determine at least one of a breakdown voltage, a threshold voltage, a state charge, an interface charge, a trapped charge, a surface charge, and an erase cycle time.

3. The method of claim 1, wherein said at least one process operation is comprised of at least one of a deposition process and a thermal growth process.

4. The method of claim 1, wherein said gate insulation layer is comprised of at least one of silicon dioxide and silicon nitride.

5. A method, comprising:

performing at least one electrical test on at least one flash memory device to determine a duration of an erase cycle performed on said flash memory device;

determining at least one parameter of at least one process operation to be performed to form at least one gate insulation layer on a subsequently formed flash memory device based upon said determined duration of said erase cycle, wherein the at least one parameter is comprised of at least one of a temperature, a pressure, a duration, a process gas flow rate, a process gas composition, a liquid flow rate, a liquid composition, and a power level setting; and performing said at least one process operation comprised of said determined at least one parameter to form said at least one gate insulation layer on said subsequently formed flash memory device.

6. The method of claim 5, wherein performing said at least one electrical test on said at least one flash memory device further comprises performing said at least one electrical test on said at least one flash memory device to determine at least one of a breakdown voltage, a threshold voltage, a state charge, an interface charge, a trapped charge, a surface charge, and a programming cycle time.

7. The method of claim 5, wherein said memory device is comprised of a gate insulation layer, a floating gate layer positioned above said gate insulation layer, an intermediate insulation layer positioned above said floating gate layer, and a control gate layer positioned above said intermediate insulation layer.

8. The method of claim 5, wherein said at least one process operation is comprised of at least one of a deposition process and a thermal growth process.

9. The method of claim 5, wherein said gate insulation layer is comprised of at least one of silicon dioxide and silicon nitride.

10. A method, comprising:

performing at least one electrical test on at least one memory device to determine a duration of a programming cycle performed on said memory device;

determining at least one parameter of at least one process operation to be performed to form at least one gate insulation layer on a subsequently formed memory device based upon said determined duration of said programming cycle, wherein the at least one parameter is comprised of at least one of a temperature, a pressure, a duration, a process gas flow rate, a process gas composition, a liquid flow rate, a liquid composition, and a power level setting; and performing said at least one process operation comprised of said determined at least one parameter to form said at least one gate insulation layer on said subsequently formed memory device.

11. A method, comprising:

performing at least one electrical test on at least one memory device to determine a duration of an erase cycle performed on said memory device;

determining at least one parameter of at least one process operation to be performed to form at least one gate insulation layer on a subsequently formed memory device based upon said determined duration of said erase cycle, wherein the at least one parameter is comprised of at least one of a temperature, a pressure, a duration, a process gas flow rate, a process gas composition, a liquid flow rate, a liquid composition, and a power level setting; and performing said at least one process operation comprised of said determined at least one parameter to form said at least one gate insulation layer on said subsequently formed memory device.

* * * * *